United States Patent [19]

Tanner

[11] Patent Number: 4,492,736
[45] Date of Patent: Jan. 8, 1985

[54] PROCESS FOR FORMING MICROCRYSTALLINE SILICON MATERIAL AND PRODUCT

[75] Inventor: David P. Tanner, Thousand Oaks, Calif.

[73] Assignee: Atlantic Richfield Company, Los Angeles, Calif.

[21] Appl. No.: 537,132

[22] Filed: Sep. 29, 1983

[51] Int. Cl.³ .............................................. B32B 9/04
[52] U.S. Cl. ....................................... 428/446; 427/39
[58] Field of Search ........................... 427/39; 428/446

[56] References Cited

PUBLICATIONS

Matsuda et al., "A Simplified Model for the Deposition Kinetics of GD a-Si:H Films", 9th Int. Conf. on Amorphous and Liquid Semiconductors, Jul. 2-8, 1981.

*Primary Examiner*—Bernard D. Pianalto
*Attorney, Agent, or Firm*—Nilsson, Robbins, Dalgarn, Berliner, Carson & Wurst

[57] ABSTRACT

A process for forming microcrystalline silicon material includes the steps of introducing a silicon-containing gas, hydrogen gas and a relatively inert gas into a work environment to form a preselected gas atmosphere, and establishing a glow discharge through the gas atmosphere. A microcrystalline thin film of silicon is formed on a substrate exposed to the discharge. In a preferred embodiment, the power level of the discharge is less than 0.08 watts per square centimeter and the film is deposited at a rate of no more than approximately two angstroms per second. Under these circumstances, the material deposited on the substrate is bombarded by ions of the relatively inert gas, causing the material to form a microcrystalline thin film.

16 Claims, 3 Drawing Figures

PROCESS FOR FORMING MICROCRYSTALLINE SILICON MATERIAL AND PRODUCT

BACKGROUND OF THE INVENTION

This invention relates to the field of solid state electronics and, more particularly, to a process for forming microcrystalline silicon material by bombarding a depositing film with inert gas ions.

Microcrystalline silicon material, defined as having a network of crystalline formations within an amorphous matrix, advantageous in many circumstances. For example, a large number of conductors make good ohmic contact to microcrystalline silicon, while only a few materials make good contact to amorphous silicon. The substitution of microcrystalline silicon increases the conductivity of a contact interface by approximately three orders of magnitude, making it possible to obtain good contact even with screen printed materials. The crystallites also increase doping efficiency of silicon over that obtainable in the amorphous state.

It has been determined that microcrystalline silicon, like amorphous silicon material, is very preparation dependent. Prior processes for forming microcrystalline silicon generally involve establishment of a glow discharge within a gaseous mixture of silane, hydrogen gas and a suitable dopant. The discharge is generally carried out at a pressure on the order of 0.06 torr and a power density between approximately 0.7 and 1.6 watts per square centimeter. The crystallinity of silicon deposited by gaseous discharge is known to increase with increasing power. However, the required power levels can have a deleterious effect on previously deposited layers of a device and can significantly increase processing costs. Processes of this type also require unduly long deposition times to obtain microcrystalline material.

A variety of diluents, including argon, have been used in the plasma deposition of silicon. However, as far as applicant is aware they have not been used for any operative effect or in a glow discharge atmosphere into which hydrogen gas is introduced as a constituent. In these systems, hydrogen gas is present, if at all, only by virtue of the dissociation and surface reaction of silane.

A system of the type described above, using argon as a diluent, is described in Matsuda, et al., "A Simplified Model for the Deposition Kinetics of GD a-Si:H Films", 9th *International Conference on Amorphous and Liquid Semiconductors*, Grenoble, July 2–8, 1981, in which a-Si:H films were deposited at powers up to 3 watts per square centimeter. Although the concentration of hydrogen and other species in the plasma was monitored by measuring optical emission intensities, it is applicant's understanding that hydrogen gas, as such, was not added to the discharge atmosphere.

Argon has also been used as a diluent in the course of investigating the growth morphology of amorphous silicon films, as described in Knights, "Growth Morphology and Defects in Plasma-Deposited a-Si:H Films", Xerox Palo Alto Research Center, and Knights, et al., "Microstructure of Plasma-Deposited a-Si:H Films", *Appl. Phys. Lett.* 35 (3), 1979. These articles do not disclose an increase in crystallinity when argon is added, but rather describe an increase in the density of defects in amorphous silicon material. Such defects, taking the form of states in the forbidden gap, hurt the transport properties of a film and are undesirable in most applications. At 230 degrees Celsius, a mimimum defect density was obtained by discharging low rf power through a pure silane atmosphere. The Knights publications thus suggest that the dilution of silane with argon leads to higher surface defects, and is undesirable. In addition, Knights apparently did not add hydrogen gas to his glow discharge atmospheres.

Ogawa, et al., "Preparations of a-Si:H From Higher Silanes ($Si_nH_{2n+2}$) With the High Growth Rate", *Japanese Journal of Applied Physics*, Volume 20, Number 9 (L639–L642) 1981, describes the use of argon as a diluent in a glow discharge of higher silanes. Ogawa attempted to obtain intrinsic amorphous silicon at a higher deposition rate. The article teaches that the deposition rate increases monotonically with an increase in rf power, gas flow rate, and partial pressure of the higher silanes. The Ogawa process does not involve the addition of hydrogen gas to the discharge and, in fact, specifically teaches that hydrogen gas should be eliminated by evacuation after the higher silanes are formed.

Therefore, it is desirable in many applications to provide an improved process for the formation of microcrystalline silicon material at relatively low powers and in relatively short times.

SUMMARY OF THE INVENTION

The present invention comprises a process for forming microcrystalline silicon, including the steps of: introducing a silicon-containing gas, hydrogen gas and a relatively inert gas into a work environment to form a preselected gas atmosphere; establishing a glow discharge through the gas atmosphere; and exposing a substrate to the glow discharge to form a microcrystalline thin film of silicon thereon. In a preferred embodiment, the power level of the discharge is less than 0.08 watts per square centimeter. The film is deposited at a rate of no more than approximately 2 angstroms per second and the substrate is exposed to the discharge for at least approximately 10 minutes. Also in the preferred embodiment, the gas atmosphere is maintained at approximately 1 torr and a flow rate of between approximately $5 \times 10^{-4}$ and $5 \times 10^{-3}$ SCCM per cubic centimeter within the work environment. The relatively inert gas, which may be argon, is present in the gas atmosphere at a relative concentration of no less than 10 atomic percent and no more than 50 atomic percent. The product of the process is also believed to be new, displaying a dark conductivity of at least 0.1 inverse ohm-centimeters and an activation energy of no more than approximately 0.03 electron volts.

As described above, others have noticed that the crystallinity of discharge-deposited silicon increases with increasing electric power. Applicants have found that the increase in crystallinity is due to bombardment of the film by highly energized ionic species at the higher power levels. In a plasma containing silane, hydrogen gas and possibly a dopant, bombardment is accomplished largely by hydrogen from the plasma. This effects the structure of the material by forming crystallites which can be identified by x-ray diffraction techniques. As far as applicant is aware, the crystalizing effects of high power have not previously been linked to ion bombardment.

Applicant has introduced argon into a glow discharge environment to enhance the bombardment effect. Argon has a higher atomic mass than hydrogen and causes a much greater effect, permitting microcrystalline silicon to be deposited at lower power and in less time than is otherwise possible. However, hydrogen gas must also be introduced to the glow discharge environment to deposit silicon under these conditions.

The power density and time required for deposition of microcrystalline silicon material have each been reduced by a factor of 2 from the levels required without the argon. In addition, n-type microcrystalline silicon produced in this manner exhibits much higher dark conductivity than the prior materials. It is therefore possible according to the present invention to obtain higher quality films by a faster and more economical process than the prior art permits.

In the context of the invention, the concentration of inert gas is an additional variable which can be used to control the deposition rate, power and other parameters. For example, the inert gas concentration determines a "window" of possible power levels for depositing microcrystalline silicon material. An increase in concentration increases the level of ion bombardment, but also increases the rate at which silicon is sputtered from the film and decreases the concentration of silicon-containing gas available for deposition. The effective deposition rate therefore decreases with increasing inert gas concentration. Ion bombardment is responsible for reducing the power required for producing microcrystalline material, and at the same time limiting the maximum power at which deposition can be achieved. If the power is increased beyond a certain level, the sputtering rate will equal the deposition rate, preventing silicon deposition.

DESCRIPTION OF THE PREFERRED EMBODIMENT

Figure 1:
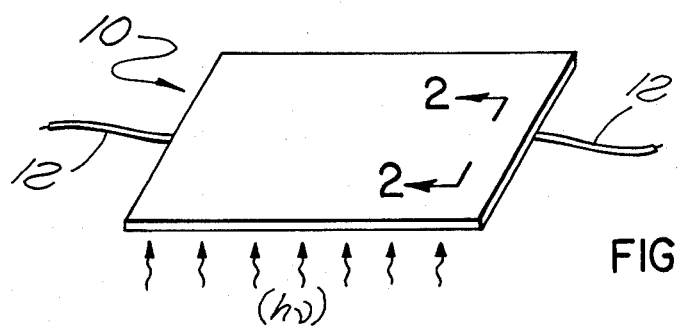
FIG. 1 is a perspective view of a solar panel having a p-i-n structure wherein the n-type layer is deposited according to the present invention.
Figure 2:
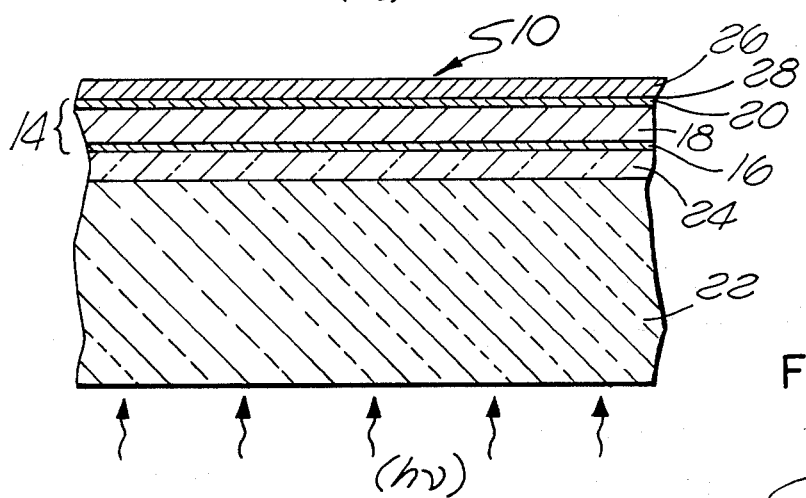
FIG. 2 is a fragmentary cross sectional view taken along the line 2—2 of FIG. 1.

With reference to FIGS. 1 and 2, a thin film solar panel 10 constructed according to the present invention is connectable to an external circuit (not shown) by a pair of leads 12. Current generated within the panel in response to incoming radiation (hv) is passed to the external circuit through the leads 12.

Referring specifically to FIG. 2, the solar panel 10 comprises a thin film p-i-n structure 14 having a p layer 16, an intrinsic layer 18 and an n layer 20, formed in sequence on a glass substrate 22. A front contact 24 is provided between the layer 16 and the glass substrate, and a metallic back contact 26 is provided over the layer 20. The n layer 20 is a thin film of microcrystalline silicon material deposited according to the present invention to provide an ohmic contact at an interface 28 with the back contact 26. The layer is deposited from a glow discharge environment made up of a suitable silicon-containing gas, hydrogen gas and a relatively inert gas in appropriate proportions. The heavy inert gas molecules are ionized by the discharge and are caused to bombard the deposited material in a manner transforming it to a more crystalline state. The bombardment phenomenon reduces the power level and time required to produce microcrystalline silicon material.

Referring to the structure of FIG. 2 in greater detail, the front contact 24 is preferably a transparent conductive oxide (TCO) layer, such as indium tin oxide (ITO), tin oxide (TO), or indium oxide (IO). ITO can be deposited onto the substrate 22 at approximately 300 degrees Celsius by evaporation of indium and tin in an oxygen atmosphere with flow discharge assistance. The glow discharge activates the oxygen to produce a high quality film. TO can be deposited using a chemical vapor process and IO is preferably deposited by reactive evaporation of indium in an activated oxygen atmosphere. When the layer 24 is made of ITO having a resistivity of $4 \times 10^{-4}$ ohm-centimeters, it can have a thickness of approximately 2,000 angstroms, or less.

The p-i-n structure 14 is preferably formed by sequential deposition from a silicon-containing glow discharge under appropriate conditions. The p layer 16 and the intrinsic layer 18 may be deposited in any known manner to produce a layer having suitable optical gap and conductivity. For example, those layers can be deposited according to the teachings of U.S. patent application Ser. No. 494,199 filed May 13, 1983 for "High Hydrogen Amorphous Silicon", the disclosure of which is hereby incorporated by reference. Accordingly, the p layer 16 preferably has an optical gap ($E_g$) between 1.85 and 1.90 eV and a dark conductivity ($\sigma_D$) between approximately $10^{-5}$ and $10^{-6}$ inverse ohm-centimeters, and may be approximately 100 angstroms thick The intrinsic layer 18 is preferably approximately 5,000 angstroms thick.

Figure 3:
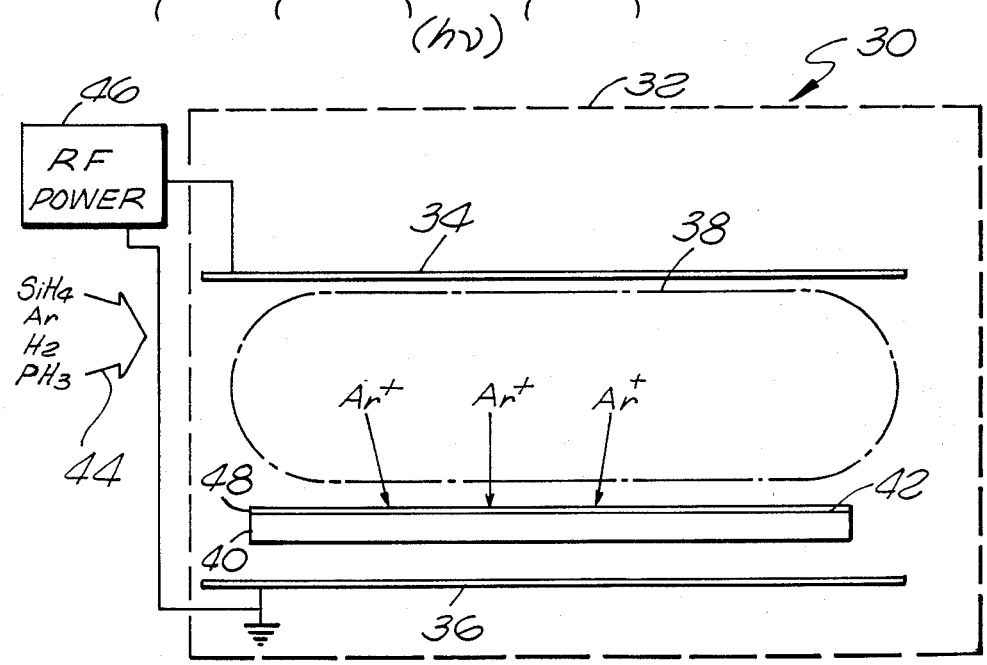
FIG. 3 is a schematic representation of an apparatus for performing the process of the present invention.

The n layer 20 is deposited according to the teachings of the present invention from a glow discharge environment containing a relatively heavy inert gas species. Although the process of the invention is not limited to practice with a particular apparatus, it will be described herein with reference to the apparatus 30 of FIG. 3. The apparatus 30 comprises a work environment 32 having upper and lower opposed electrodes 34 and 36, respectively, for discharge of electrical energy through a gas atmosphere in a manner producing a glow discharge plasma 38 therein. A substrate 40 is positioned between the electrodes at a location near the electrode 36, such that material from the plasma is deposited onto an upper surface 42 of the substrate. The plasma-forming gas is introduced to the work environment 32, as illustrated at 44, and preferably comprises a flow of gas having a preselected composition and low flow rate. Power is applied to the electrodes through an rf power supply 46, with the electrode 36 being grounded.

According to the preferred embodiment of the invention, the gas atmosphere comprises a suitable silicon-containing gas, hydrogen gas, a relatively heavy inert gas and a suitable dopant gas. The dopant gas may be eliminated if it is desired to form an intrinsic microcrystalline layer. The concentration of inert gas can be varied considerably within the context of the invention, but should be maintained between approximately 10 and 50 atomic percent, by volume, of the gas atmosphere. The bombardment effect is relatively insignificant at concentrations less than approximately 10 percent by volume, and the deposition rate decreases drastically at over 50 percent. The inert gas concentration is preferably between 30 and 50 percent, by volume. Most preferably, the atmosphere includes the silicon-containing gas, hydrogen gas and the inert gas in a relative volumetric abundance of approximately 1:5:5. That is, 5 parts of hydrogen gas and 5 parts of the inert gas are introduced for every one part of the silicon-containing gas. The gas atmosphere is maintained at a pressure of at least approximately 1 torr, and preferably between 1 and 3 torr, to provide a suitably high deposition rate without causing the system to arc. The optimal pressure in the system described herein is preferably approximately 2 torr. The flow rate of the gas atmosphere through the deposition environment, in units of SCCM per cubic centimeter, is no more than $5 \times 10^{-3}$, preferably between $5 \times 10^{-4}$ and $5 \times 10^{-3}$, and most preferably $5 \times 10^{-3}$. Although not bound by any theory, it is believed that flow rates of $5 \times 10^{-3}$ SCCM per cubic centimeters, or less, permit sufficient depletion of the constituent elements in the gas atmosphere to yield microcrystalline films.

The silicon-containing gas may comprise, without limitation, one or more of the following: silane ($SiH_4$); the higher silanes ($Si_nH_{2n+2}$), silicon tetrafluoride ($SiF_4$); and tetramethyl silane ($SiH_3CH_3$). Although the experimental data presented herein relates exclusively to gas atmospheres containing silane and the higher silanes, the other listed gases are believed to be useful in the process, as well, possibly with minor adjustments in the deposition parameters. Each gas supplies the basic element, silicon, and is suitable for glow discharge deposition in an atmosphere containing hydrogen gas.

The inert gases believed useful in the practice of the invention include, without limitation, helium (He), neon (Ne), argon (Ar), krypton (Kr) and xenon (Xe). Each of the listed gases is substantially heavier than hydrogen and would provide an increased bombardment effect according to the present invention. Although the experimental work performed by Applicant has thus far been limited to the use of argon as a bombarding species, it is believed that helium and neon would serve the same purpose, albeit less sufficiently, and that krypton and xenon would work even more efficiently. Thus, it should be possible to further decrease the power and time requirements for depositing microcrystalline silicon material according to the present invention by substituting krypton or xenon for the argon.

In operation, rf power is applied to the electrodes 34 and 36 at a level giving rise to a power density less than a predetermined maximum. At densities above the maximum, material is sputtered by the plasma as fast as it is deposited. In the case of argon gas at the concentrations and pressures described herein, the maximum value is approximately 0.20 watts per square centimeter, and preferably approximately 0.08 watts per square centimeters, although the power density can be as high as 0.30 watts per square centimeter for other compositions. The minimum power density at which microcrystalline films have been obtained according to the parameters and materials described herein, and therefore the optimal power density for these purposes, is 0.03 watts per square centimeter. For a given gas composition and pressure, an increase in applied power reduces the time required to obtain microcrystallinity. When the electrodes are circular and are 40 centimeters in diameter, as is the case in applicant's experimental apparatus, a power density of 0.08 watts per square centimeter corresponds to an applied power of 100 watts.

Molecules of the inert gas are ionized within the glow discharge 38 by removal of one or more electrons, producing positive ions which are alternately attracted to and repelled from the lower electrode. This causes the ions to bombard a depositing layer 48 on the surface of the substrate, compacting the layer and forming crystalline regions therein. While not bound by any theory, it is believed that some of the atoms within the film are initially bound more tightly than others and that bombardment causes loosely bound atoms to be removed. The remaining material has a higher concentration of the more tightly bound atoms, such as those in a crystalline formation. As the process proceeds, a coherent film having a relatively high degree of crystallinity is grown. It is therefore believed that the creation of microcrystallinity is a mechanical phenomenon caused by ion bombardment, rather than by a chemical process such as etching.

The ranges of electrical power density, gas composition, gas pressure, gas flow rate and time of deposition are chosen to permit sufficient bombardment to crystallize the material without halting the deposition process. In this context, the deposition rate is maintained at a relatively low level, preferably no more than approximately two angstroms per second, and most preferably between one and two angstroms per second, to provide adequate bombardment. The layer begins exhibiting microcrystalline characteristics after exposure to the discharge for at least approximately ten minutes, although it may be desirable to continue deposition for twenty minutes or more. After ten minutes, the layer remains microcrystalline and increases in thickness until a desired thickness is obtained. In the context of the solar panel 10 of FIG. 2, the thickness of the n layer 20 is at least 500 angstroms.

The solar panel 10 is completed by applying the metallic back contact 26 over the n layer 20. In a preferred embodiment, the back contact 26 may be applied by any suitable process, such as screen printing or vacuum deposition, to a depth providing suitable conductivity. The crystallinity of the n layer 20 permits an ohmic contact to be obtained between the n layer and the back contact 26 for a wide variety of contact materials, including screen printed silver material. The contact can thus be formed by applying a conventional epoxy-based silver/graphite material over the n layer 20 and heating the material to approximately 100 degrees Celsius to cure the epoxy. In the case of screen printing, the electrode material is preferably applied to a thickness of approximately 25 microns.

In use, the solar panel 10 is exposed to radiation (hv) which passes through the glass substrate 22 and the front contact portion 24 to reach the p-i-n structure 14. Because the p layer 16 has a high optical gap and is very thin, incoming light passes through it for absorption by the active instrinsic layer 18. The thickness of the instrinsic layer causes most of the light to be absorbed by it for conversion to electrical energy, and any light passed by the layer 18 is preferably reflected back through the intrinsic layer by the back contact 26. As a result of the photovoltaic effect within the p-i-n structure 14, an electrical voltage is applied to the leads 12 of the solar panel (FIG. 1).

A number of microcrystalline layers useful in the context of the solar panel 10, as well as in a variety of other applications calling for microcrystalline silicon material, have been made by applicant using an experimental apparatus similar to the apparatus 30. A substrate was placed between a pair of opposed circular electrodes which were 40 centimeters in diameter, and rf power was applied to the electrodes at a variety of levels. The dc potential of the top electrode was allowed to float and was measured to be approximately 50 volts, presumably due to ion bombardment. Deposition was undertaken using two different gas compositions, each at a pressure of 2 torr and a flow rate through the work environment of approximately $5 \times 10^{-3}$ SCCM per cubic centimeter. The first gas composition, referred to herein as "I", contains silane, hydrogen gas, and phosphine (PH3) in the relative volumetric proportions 1:10:0.005. In the second composition, referred to as "II", argon is substituted for one half of the hydrogen gas, yielding a silane, hydrogen, argon and phosphine mixture in the volumetric proportion 1:5:5:0.005. The results of the depositions are shown in Table 1 as functions of applied rf power, power density between the electrodes, and time of deposition. The dark conductivities ($\sigma_D$) and activation energies ($E_A$) are given as measures of film crystallinity. N-type material having a conductivity up to $10^{-3}$ inverse ohm-centimeters is considered amorphous, while material having a conductivity of approximately $10^{-1}$ inverse ohm-centimeters, or more, is microcrystalline. This has been verified by x-ray fluorescence analysis. Microcrystalline n-type silicon produced according to the present invention has a conductivity greater than approximately 0.1 inverse ohm-centimeter, and preferably greater than 1.0 inverse ohm-centimeter. Most preferably, its conductivity will be between 5 and 10, and possibly as high as 20 or more, inverse ohm-centimeters. These values are to be compared with the maximum reported conductivity known to applicant of approximately 1 inverse ohm-centimeter for glow dischargeproduced (n-type microcrystalline) silicon. Similarly, activation energies of 0.2 electron volts (eV) or more are indicative of amorphous n-type silicon, while energies between 0.01 and 0.02 are clearly microcrystalline. The conductivities of films at least 2000 angstroms thick were measured by painting two conductive electrodes onto the films with silver paint and measuring the conductance between them, and the activation energies were determined by measuring the slope of $\sigma_D$, plotted as a function of 1/T.

TABLE 1

| Gas Composition | Power (Watts) | Power Density (Watts/cm$^2$) | Time (Minutes) | $\sigma_D$ ($\Omega$-cm)$^{-1}$ | $E_A$ (eV) |
|---|---|---|---|---|---|
| I (SiH4;H2;PH3) | 250 | .20 | 12 | 7. | .03 |
| " | 250 | .20 | 5 | $10^{-4}$ | .4 |
| " | 100 | .08 | 20 | 5 | .01 |
| " | 100 | .08 | 10 | .1 | — |
| " | 100 | .08 | 5 | $10^{-5}$ | .65 |
| II (SiH4;H2;Ar;PH3) | 100 | .08 | (no deposition) | | |
| " | 75 | .06 | 10 | .3 (thin) | .03 |
| " | 50 | .04 | 20 | 13 | .01 |
| " | 50 | .04 | 10 | .1 | .04 |
| " | 25 | .02 | 20 | $10^{-3}$ | .33 |

As shown in Table 1, the power density and time required for depositing microcrystalline silicon are drastically reduced by adding argon in equal proportions to hydrogen in the deposition gas. Without argon, a microcrystalline film having a dark conductivity of 5 inverse ohm-centimeters is prepared by discharging 100 watts of power through the deposition gas for a period of 20 minutes. With argon, a more conductive film can be deposited at 50 watts in the same time period. The power requirement is thus reduced by a factor of 2, while the dark conductivity is more than doubled and the activation energy is unchanged. In fact, microcrystalline silicon has been deposited in as little as 10 minutes at 50 watts of applied power, with the use of argon.

The same deposition process has been performed without phosphine, and then with diborane (B2H6) instead of phosphine. The results in each case were analogous to those disclosed in Table 1. In the case of diborane the dark conductivity ($\sigma_D$) increased by a factor of 10, from 0.2 inverse ohm-centimeters to 2.0 inverse ohm-centimeters, when argon was substituted for half of the hydrogen gas. It is believed that the intrinsic and p-type microcrystalline silicon obtainable in this way will be useful in a variety of contexts in which a high doping efficiency is desired.

Deposition was also attempted under the circumstances described above from a mixture of silane and argon, without adding hydrogen gas. However, applicant was then unable to obtain a film within the relevant power ranges and time frames. Therefore, it appears that the addition of hydrogen in the form of hydrogen gas is required to perform the process of the present invention. The hydrogen content of silane is not adequate for these purposes.

Solar cells constructed in the manner of the panel 10, as described above in relation to FIGS. 1 and 2, have been prepared with n layers 20 deposited according to the process of the present invention. The layers 20 were deposited in the apparatus 30 from a gas mixture having the composition II of Table 1, at a power density of 0.04 watts per square centimeter. The layer 20 was deposited to a thickness of approximately 500 angstroms and was covered with a screen printed silver back electrode. In depositing the n-layer 20, the substrate 40 shown in FIG. 3 comprised a layered structure made up of the glass substrate 22, the front contact 24 and the silicon layers 16 and 18. The upper surface 42 of FIG. 3 was thus the upper surface of the intrinsic layer 18. The other elements of the solar cell were deposited in the manner described in the abovereferenced copending U.S. patent application for "High Hydrogen Amorphous Silicon". The cells obtained in this way exhibited the following photovoltaic parameters: $V_{oc}$=785 millivolts; $J_{sc}$=11.5 milliamperes per square centimeter; and FF(fill factor)=57%.

From the above, it can be seen that there has been provided a process for depositing high quality microcrystalline silicon material from a gas discharge, at substantially lower power levels and in less time than has previously been possible. In fact, the deposited material is higher in quality than any other microcrystalline silicon material known to Applicant.

The appended claims are not limited to the embodiments described herein, but rather are intended to cover all variations and adaptations falling within the true scope and spirit of the present invention. For example, the specific silicon-containing gas and inert gas can be altered without deviating from the present invention, and the power discharged through the gas is not necessarily limited to rf power.

I claim:

1. A process for forming microcrystalline silicon comprising the steps of:
   introducing a silicon-containing gas, hydrogen gas and a relatively inert gas into a work environment to form a preselected gas atmosphere;
   the relative concentration of the inert gas being no less than approximately 10 volumetric percent and no more than approximately 50 volumetric percent, and the gas atmosphere being maintained at a flow rate of no more than approximately $5 \times 10^{-3}$ SCCM per cubic centimeter within the work environment;

establishing a glow discharge through the gas atmosphere; at a power level less than 0.3 watts per square centimeter; and exposing a substrate to the glow discharge to form a microcrystalline thin film of silicon thereon.

2. The process of claim 1 wherein:
the power level of the discharge is less than 0.08 watts per square centimeter.

3. The process of claim 2 wherein:
the relatively inert gas is chosen from the group consisting of helium, neon, argon, krypton and xenon.

4. The process of claim 3 wherein:
the gas atmosphere includes the silicon-containing gas, hydrogen gas and the inert gas in a relative volumetric abundance of approximately 1:5:5.

5. The process of claim 3 wherein:
a dopant-containing gas is introduced into the work environment to dope the film.

6. The process of claim 5 wherein:
the dopant-containing gas comprises $PH_3$.

7. The process of claim 3 wherein:
the glow discharge is an rf discharge between a pair of capacitively-coupled electrode means.

8. The product by the process of claim 2 whch has a dark conductivity of at least approximately 0.1 inverse ohm-centimeters and an activation energy of no more than approximately 0.03 electron volts.

9. The product of claim 8 which has a conductivity greater than 1.0 inverse ohm-centimeter.

10. The process of claim 2 wherein:
the film is deposited at a rate of no more than approximately 2 angstroms per second.

11. The process of claim 10 wherein:
the substrate is exposed to the discharge for at least approximately ten minutes.

12. The process of claim 11 wherein:
the microcrystalline film is formed by bombarding material deposited on the substrate with ions of the relatively inert material.

13. The process of claim 11 wherein:
the gas atmosphere is maintained at a pressure of at least approximately 1 torr.

14. The product by the process of claim 13 which has a dark conductivity of at least aproximately 0.1 inverse ohm-centimeters and an activation energy of no more than approximately 0.03 electron volts.

15. A process for forming microcrystalline silicon comprising the steps of:
introducing silane, hydrogen gas and argon into a work environment to form a preselected gas atmosphere at a pressure of at least 1 torr, the relative volumetric abundance of silane, hydrogen gas and argon in the atmosphere being approximately 1:5:5 and the atmosphere being maintained at a flow rate of no more than approximately $5 \times 10^{-3}$ SCCM per cubic centimeter within the work environment;

establishing a glow discharge through the gas atmosphere at a power level less than 0.08 watts per square centimeter; and exposing a substrate to the glow discharge for at least approximately 10 minutes to form a microcrystalline thin film of silicon thereon at a rate of between approximately 1 and 2 angstroms per second.

16. The product by the process of claim 15 which has a conductivity greater than 1.0 inverse ohm-centimeter.

* * * * *